United States Patent [19]
Shou et al.

[11] Patent Number: 5,841,315
[45] Date of Patent: Nov. 24, 1998

[54] MATCHED FILTER CIRCUIT

[75] Inventors: Guoliang Shou; Changming Zhou; Kazunori Motohashi; Xiaoling Qin; Shengmin Lin; Makoto Yamamoto; Sunao Takatori, all of Tokyo, Japan

[73] Assignees: Yozan Inc., Tokyo; Sharp Kabushiki Kaisha, Osaha, both of Japan

[21] Appl. No.: 686,958

[22] Filed: Jul. 26, 1996

[30] Foreign Application Priority Data

Jul. 28, 1995 [JP] Japan .................................. 7-212438

[51] Int. Cl.[6] ........................ H03K 5/00; H03K 12/00; G11C 27/02
[52] U.S. Cl. ........................ 327/552; 327/554; 327/94; 327/403; 327/361; 364/724.11
[58] Field of Search ................... 327/94, 91, 552, 327/553, 555, 556, 557, 558, 559, 403, 407, 361; 364/724.11

[56] References Cited

U.S. PATENT DOCUMENTS

| | | | |
|---|---|---|---|
| 4,507,746 | 3/1985 | Fletcher, Jr. | 364/717 |
| 5,388,063 | 2/1995 | Takatori | 364/724.17 |
| 5,396,446 | 3/1995 | Shou | 364/825 |
| 5,408,192 | 4/1995 | Bailey | 327/254 |
| 5,465,064 | 11/1995 | Shou et al. | 327/407 |
| 5,495,192 | 2/1996 | Shou et al. | 327/94 |
| 5,500,810 | 3/1996 | Shou | 364/724.16 |
| 5,502,664 | 3/1996 | Shou | 364/724.16 |
| 5,563,812 | 10/1996 | Shou | 364/606 |

OTHER PUBLICATIONS

D. Fenna "Free Filter For Serial Data", Electronic Product Design, p. 22, Mar. 1982.

Ogawa et al., "Development of 1 Chip SS Communication LSI Using Digital Matched Filters", Technical Report of IECE, ISEC94–42, SST94–65 (1994–12), pp. 33–38.

"Dual 64–Tap, 11 Mcps, Digital Matched Filter/Correlator", STEL–3310, Stanford Telecommunications.

Nauerz et al., "The Suitability of Modern CMOS Gate Array Circuits as Corelators and Matched Filters for Spread–Spectrum Signals", IEEE, vol. 2 of 3, pp. 473–478, 1987.

*Primary Examiner*—Toan Tran
*Assistant Examiner*—Dinh Le
*Attorney, Agent, or Firm*—Cushman Darby & Cushman IP Group of Pillsbury Madison & Sutro LLP

[57] ABSTRACT

An object of the present invention is to provide a matched filter circuit of small size and consuming low electric power. Paying attention that a spreading code is a 1 bit data string, an input signal is sampled and held as an analog signal along the time sequence, classified into "1" and "–1" and the classified signals are added in parallel by capacitive coupling in a matched filter circuit according to the present invention.

6 Claims, 3 Drawing Sheets

MATCHED FILTER CIRCUIT

FIELD OF THE INVENTION

The present invention relates to a matched filter circuit, especially to a matched filter effective for a spread spectrum communication system for mobile cellular radio and wireless LAN.

BACKGROUND OF THE INVENTION

A matched filter is a filter for judging the identification between two signals. In spread spectrum communication, each user who receives a signal processes a received signal by a matched filter using a spreading code allocated for the user so as to find a correlation peak for acquisition and holding.

Here, assuming that a spreading code is d(i), sampling interval is Δt, a length of diffusion code is N, and a received signal before a time t is x(t−i Δt), then a correlation output y(t) of matched filter is as in formula (1). In formula (1), d(i) is a data string of 1 bit data.

$$y(t) = \sum_{i=0}^{N-1} d(i) \times (t - i\Delta t) \quad (1)$$

It is necessary to perform double sampling or a higher order of sampling for acquisition. In this case, the operation in the formula (1) is performed at the same time in a plurality of systems. Conventionally, a digital circuit or SAW device (surface acoustic wave device) is used for the processing. There were problems that when a digital circuit is used, the size of circuit is large and consumption power is also large. Therefore it is not suitable for mobile radio communication. When a SAW device is used, the total Circuit cannot be incorporated within one LSI and the S/N ratio is low.

SUMMARY OF THE INVENTION

An object of the present invention is to solve the above conventional problems and to provide a matched filter circuit of small size and low electric power consumption.

Paving attention that a spreading code is a 1 bit data string, an input signal is sampled and held as an analog signal in the time sequence; classified into "1"; and "−1" and the classified signals are added in parallel by capacitive coupling in a matched filter circuit according to the present invention.

It is possible to process in high speed by a LSI of small size and low electric power by the matched filter circuit according to the present invention.

PREFERRED EMBODIMENT OF THE PRESENT INVENTION

Figure 1:
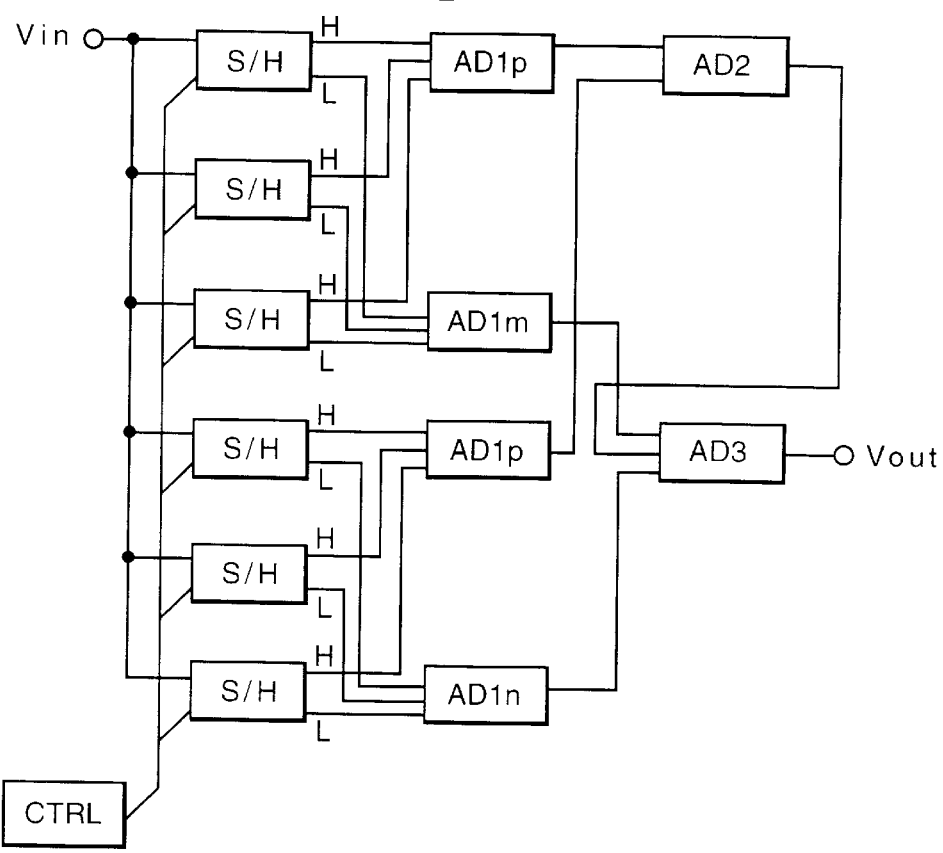
FIG. 1 shows a block diagram of a preferred embodiment of a matched filter circuit according to the present invention.

Hereinafter, the first embodiment of a filter circuit according to the present invention is described by referring to the drawings.

As illustrated in FIG. 1, a matched filter circuit according to the present invention includes a plurality of sampling and holding circuits S/H parallelly receiving an input voltage Vin. Two types of outputs H (high) and L (low) are generated from each sampling and holding circuit. A control circuits CTRL is connected to the sampling and holding circuit so as to control Vin to be input to one of the sampling and holding circuits, successively.

The sampling and holding circuit outputs the input voltage Vin to either H side or L side according to the control of the control circuit CTRL. A reference voltage Vr is connected by the control circuit to the sampling and holding circuits. This route selection performed according to a 1 bit spreading code and a multiplication of an input voltage by the code is completed only by this selection.

Figure 2:
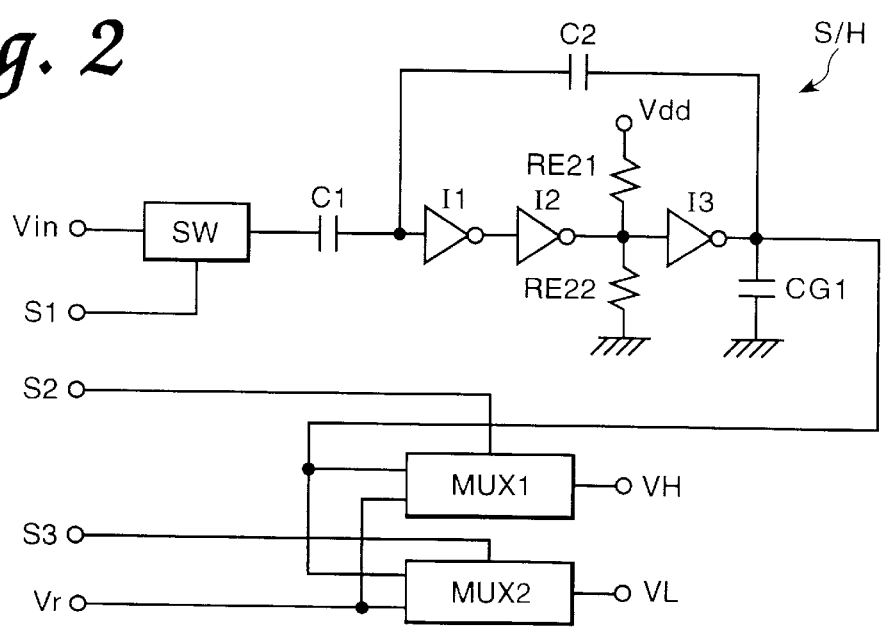
FIG. 2 shows a sampling and holding circuit of the embodiment shown in FIG. 1.

A sampling and holding circuit S/H is structured as in FIG. 2 in which an input voltage Vin is connected to a switch SW. An output of switch SW is connected to a capacitance C1, and three stages of serial MOS inverters I1, I2 and I3 are connected to an output of capacitance C1. An output of MOS inverter I3 of the last stage is connected to an input of I1 through a feedback capacitance C2. Consequently, an inversion of Vin is generated at the output of I3 with good linearity. The output of I3 is input to two multi-plexers MUX1 and MUX2. A common reference voltage Vr is connected to the multi-plexers. When switch is closed, capacitance C1 is charged by an electric change corresponding to Vin, and the linearity of an output is guaranteed by a feed-back function of I3 to I1. When switch SW is open afterward, sampling and holding circuit S/H holds Vin.

Switch SW, multi-plexers MUX1 and MUX2 are controlled by control signals S1, S2 and S3. After S1 is once closed, SW1 is opened at the timing of sampling the input voltage. S2 and S3 are inverted signals of each other. When one of the multiplexer outputs Vin, the other outputs Vr.

MUX1 generates an output of H (high type) and MUX2 generates an output of L (low type). H and L correspond to each bit of the spreading codes "1" and "−1". When the code "1" is to be multiplied to an input voltage at a timing, Vin is output from MUX1, and when the code "−1" is to be multiplied, Vin is output from MUX2.

The output from I3 of the last stage is connected to the ground through a grounded capacitance CG1. An output of I2 of the second stage is connected to a supply voltage Vdd and the ground through a pair of balancing resistances RE21 and RE22. Unstable oscillations of an inverted amplifying circuit including a feedback circuit is prevented by such structure.

Figure 3:
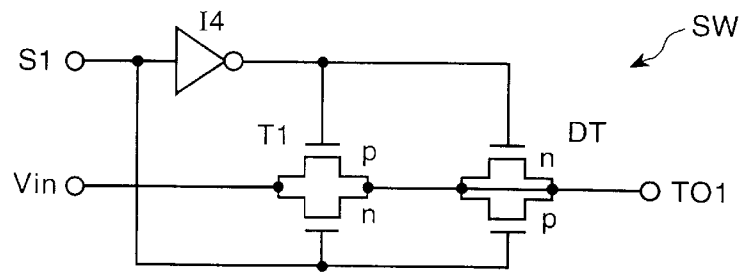
FIG. 3 shows a switch of the embodiment shown in FIG. 1.

As shown in FIG. 3, a switch SW includes a transistor circuit T1 in which a source and a drain of a n-type MOS transistor are connected to a drain and a source of a p-type MOS transistor, respectively. Vin is connected to a terminal of a drain of the nMOS of the transistor circuit and a terminal of a source of nMOS is connected to an output terminal TO1 through a dummy transistor DT similar to the nMOS. S1 is input to the gate of the nMOS transistor of the transistor circuit T1, and an inverted signal of S1 by an inverter I4 is input to the gate of PMOS transistor. When S1 is a high level, T1 is conductive and when it is a low level, T1 is cut off.

Figure 4:
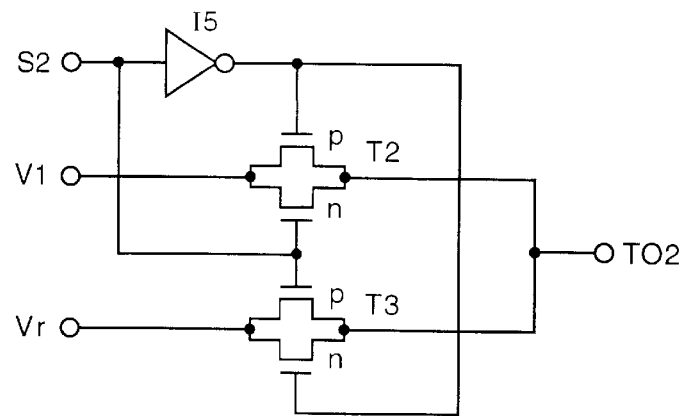
FIG. 4 shows a multi-plexer of the embodiment shown in FIG. 1.

As illustrated in FIG. 4, a multiplexer includes transistor circuits T2 and T3 each consisting of nMOS and pMOS. A source of nMOS and drain of pMOS are connected to each other and to a common output terminal TO2

In multiplexer MUX1, the terminals of the sources of nMOS of transistor circuits T2 and T3 are connected to the common output terminal TO2. An output of the MOS inverter I3 ("V1" in FIG. 4) is connected to a terminal of a drain of the nMOS of T2, and the reference voltage Vr is connected to a drain of T3. The signal S2 is input to a gate of the nMOS transistor of transistor circuit T2 and a gate of the pMOS transistor of transistor circuit T3. The signal S2 inverted by inverter I5 is input to a gates of the pMOS of T2 and nMOS of T3. When S2 is a high level, T2 is conductive and T3 is cut off, and when a low level, T3 is conductive and T2 is cut off. That is, MUX1 alternatively output V1 or Vr in response to the control signal S2. Though it is not shown in the figure, multi-plexer MUX2 is structured in the same way as MUX1 and V1 and Vr are connected inversely. Vr and V1 of FIG. 4 are connected to T2 and T3, respectively, opposite to the construction of FIG. 4. Consequently, MUX2 outputs inversely to MUX1; that is, when MUX1 outputs V1, MUX2 outputs Vr and when MUX1 output Vr, MUX 2 outputs V1.

Signal S2 corresponds to the spreading code and outputs 1×V1−V1 to Ad1p when S2=1. At this time, S3 is −1 and Vr corresponding 0 is output to Ad1m. When S2=−1, Vr corresponding to 0 is output to Ad1p. Here, S3=+1 and outputs 1×V1=V1 to Ad1m.

Expressing a received signal on a timing t as Vin(t) using input signal Vin, and X(t) in formula (1) as Vin(t), formula (1) can be expressed as in formula (2).

$$y(t) = \sum_{i=0}^{N-1} d(i) Vin(t - i\Delta t) \tag{2}$$

The Vin(t−i Δt) is an input voltage held in each sampling and holding circuit, and d(i) is the signal S to be input to each sampling and holding circuit at a time. The spreading code is given in a predetermined order to the signals held. When a new signal is taken, the oldest signal is substituted by the newest signal. It causes a change in relationship between S/H and d(i); d(i) is shifted with respect to S/H by the control circuit. When a code shift is not performed, a code transfer is performed between successive S/Hs and some errors will be generated due to the data transfer. It will be understood that the code shift is effective against preventing the error during data transfer.

The accumulation in formula (2) is performed in addition portions from AD1 to AD3; VH and VL of output voltages of each sampling and holding circuit are accumulated in AD3 and AD2, respectively. This accumulation is not performed directly. S/H are divided into a plurality groups; outputs VH and VL are once accumulated by AD1 in each group. All of the outputs of ADp1 accumulated VH, are input to AD2, and all of the outputs of Ad1m, accumulated VL, are input to AD3. In FIG. 1, six (S/H)s are divided into two groups with three S/Hs. Generally, a spreading code includes from 100 to several hundreds or more bits. The number of (S/H)s required are set by the number corresponding to the number of bits, included in the spreading code.

Figure 5:
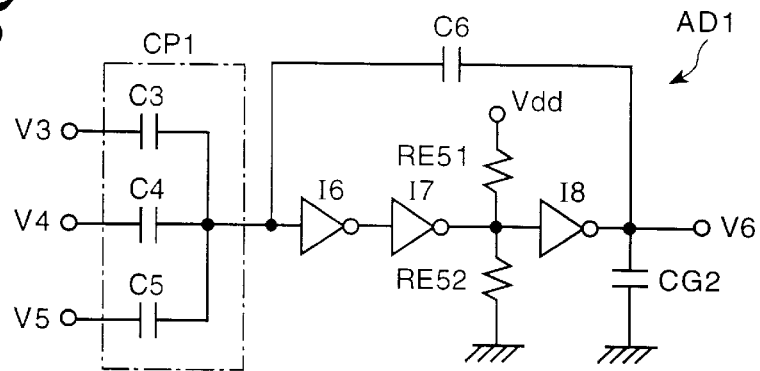
FIG. 5 shows a first addition portion of the embodiment shown in FIG. 1.

As shown in FIG. 5, an addition portion Ad1 includes a capacitive coupling CP1 constructed by capacitances C3, C4 and C5. The number equal to the number of capacitances S/Hs in one group. An output of CP1 is connected to three serial stages of MOS inverters I6, I7 and I8. An output of MOS inverter I8 of the last stage is connected to an input of I6 through a feedback capacitance C6. An output of CP1 is generated at an output of I8 with good linearity. Assuming input voltages of capacitances C3, C4 and C5 to be V3, V4 and V5, an output V6 of I8 can be expressed by the formula (3).

$$V6 = -(C3V3 + C4V4 + C5V5)/C6 \tag{3}$$

Here, V3, V4 and V5 are voltages referencing the reference voltage Vr. Also if C3=C4=C5=C6/3, a normalized output of inverted addition value can be obtained as in formula (4).

$$V6 = -(V3 + V4 + V5)/3 \tag{4}$$

By the normalization, the maximum voltage is limited to be under the supply voltage.

An output of the last stage inverter I8 is connected to the ground through a grounded capacitance CG2. An output of the second stage inverter I7 is connected to the supply voltage Vdd and the ground through a pair of balancing resistances RE51 and RE52, respectively. The unstable oscillation of inverted amplifying circuit including a feedback line is prevented by the structure.

Figure 6:
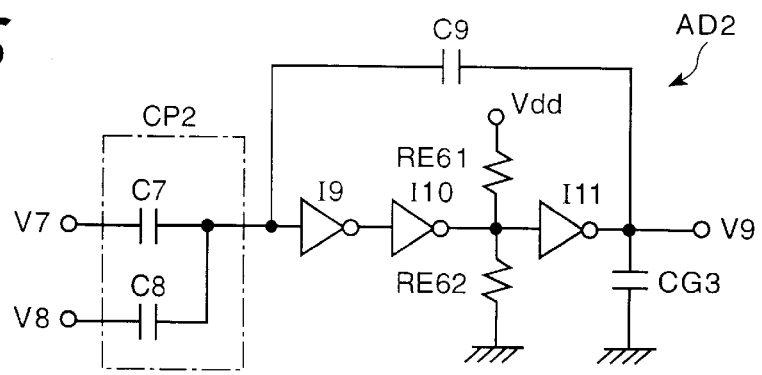
FIG. 6 shows a second addition portion of the embodiment shown in FIG. 1.

As shown in FIG. 6, an addition portion AD2 includes a capacitive coupling CP2 which includes capacitances C7 and C8. The number of capacitances equals to the number of the addition portions AD1 in a group. The output of CP2 is connected to three stages serial MOS inverters I9, I10 and I11. An output of MOS inverter I11 of a last stage is connected to an input of I9 through a feedback capacitance C9. An output of CP2 is generated at an output of I11 with good linearity. Assuming input voltages of capacitances C7 and C8 to be V7 and V8, an output V9 of I11 can be expressed by the formula (5).

$$V9 = -(C7V7 + C8V8)/C9 \tag{5}$$

Here, defining V7 and V8 are voltages referencing the reference voltage Vr and C7=C8=C9/2, a normalized output of an inverted addition is obtained as in formula (6).

$$V6 = -(V7 + V8)/2 \tag{6}$$

By the normalization, the maximum voltage is limited to be under the supply voltage.

An output of the last stage inverter I11 is connected to the ground through a grounded capacitance CG3. An output of the second stage inverter I10 is connected to the supply voltage Vdd and the ground through a pair of balancing resistances RE61 and RE62. The unstable oscillation of inverted amplifying circuit including a feedback line is prevented.

Figure 7:
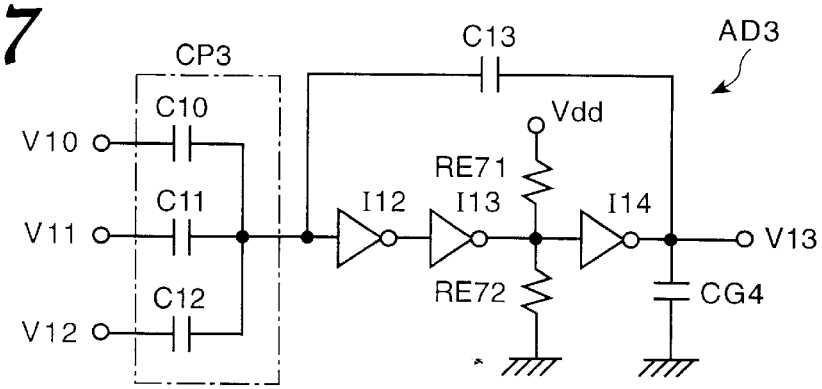
FIG. 7 shows a third addition portion of in the embodiment shown in FIG. 1.

As shown in FIG. 7, an addition portion AD3 includes a capacitive coupling CP3 which includes capacitances C10, C11 and C12. The number of capacitances corresponding to the number of connected AD1s and AD2s in a group. An output of CP3 is connected to three stages serial MOS inverters I12, I13 and I14.

An output of MOS inverter I14 of a last stage is connected to an input of I12 through a feedback capacitance C13. An output of CP3 is generated at an output of I14 with a good linearity. Assuming input voltages of capacitances C10, C11 and C12 (the voltage referencing Vr) to be V10, V11 and V12, an output V13 of I14 (the voltage referencing Vr) can be expressed by the formula (7)

$$V13=-(C10V10+C11V11+C12V12)/C13 \quad (7)$$

Defining $C10=C11=C12/2=C13/2_1$, a normalized output of inverted addition value can be obtained as in formula (8).

$$V13=-(V10+V11\ 2V12)/2 \quad (8)$$

Here, the weight of C12 is defined as twice the weights of C10 and C11 so as to cancel the influence of the normalization by AD2 and to agree to unnormalized V10 and V11. By the normalization, the maximum voltage is limited to be under the supply voltage.

An output of the last stage inverter I14 is connected to the ground through a grounded capacitance CG4. An output of a second stage inverter I13 is connected to the supply voltage Vdd and the ground through a pair of balancing resistances RE71 and RE72, respectively. The unstable oscillation is prevented.

Generalizing the operations of AD1, AD2 and AD3, an output V9 of AD2 is as in formula (9), in which a signal S2 for i-th S/H is assumed to be S2(i) and the inverted signal of it is assumed to be IS2(i).

$$V9 = \sum_{i=0}^{N-1} IS2(i)V(t-i\Delta t)/N \quad (9)$$

For obtaining V13 of the output of AD3, the operations in the formulas (10) and (11) are performed.

$$V13 = -\sum_{i=0}^{N-1} \{NV9 - S2(i)V(t-i\Delta t)\}/N \quad (10)$$

$$= \sum_{i=0}^{N-1} \{S2(i)V(t-i\Delta t) - IS2(i)V(t-i\Delta t)/N\} \quad (11)$$

Here, it is defined as below.
S2(i)=1 or −1
when S2(i)=1, IS2(i)=−1
when 32(i)==−1, IS2(i)=1

Figure 8:
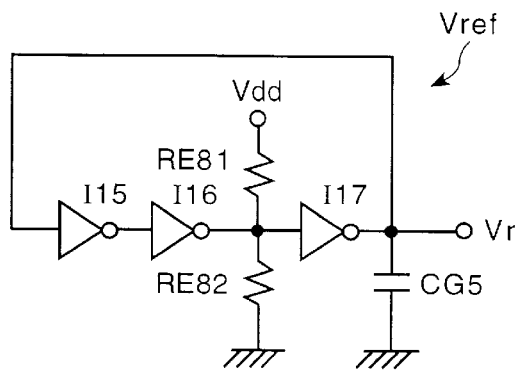
FIG. 8 shows a reference voltage generating circuit shown in FIG. 1.

The reference voltage Vr is generated by a reference voltage generating circuit Vref in FIG. 8. The reference voltage generating circuit includes three stages of serial inverters I15, I16 and I17, and an output of the last stage is fed back to the first stage input. Similar to the inverted amplifying portions, unstable oscillation is prevented by a grounded capacitance CG5 and balancing resistances RE81 and RE82. The output of the reference voltage circuit converges to a stable point on which an input and output voltages are equal to each other, and any reference voltage can be generated by changing the threshold of each inverter. Generally, in many cases, it is settled that Vr=Vdd/2 in order to keep dynamic range enough large in both directions of plus an minus. Here, Vdd is the supply voltage of MOS inverter.

Concerning to the matched filter circuit above, the size of the circuit is largely reduced by only comparing digital one, and processing speed is high because of the parallel addition. As the inputs and outputs of the sampling and holding circuit and addition portion are all voltage signals, electric power consumption is low.

Figure 9:
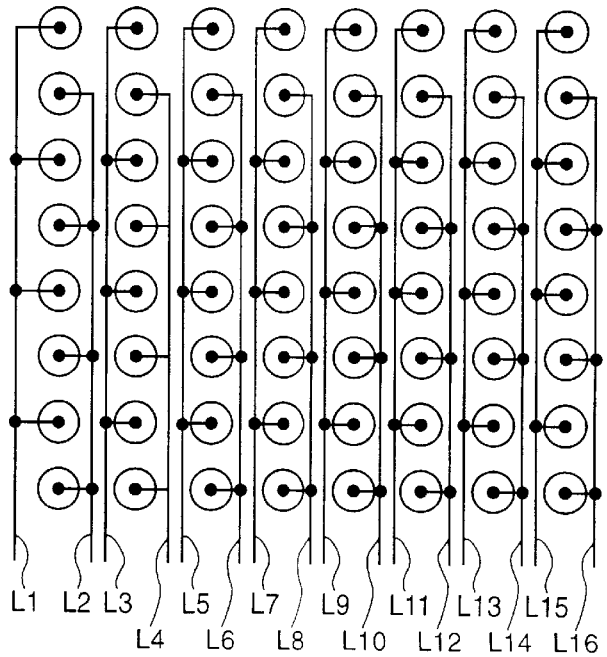
FIG. 9 shows a plan view of capacitances in FIG. 1.

The accuracy of an output of an addition portion depends on the dispersion in characteristics of the MOS inverters and in the capacity ratios of the capacitances. The dispersion of the inverters can be minimized by placing them closely to one another. The accuracy of the capacity ratio of a capacitance can be improved by dispersively connecting a plurality of unit capacitances as shown in FIG. 9. In the Figure, lines from L1 to L16 are provided for connecting unit capacitances of I6 numbers of capacitances. L1 and L2 are connected to every other unit capacitances among unit capacitances aligned on one straight line. In the same way, L3 and L4 are connected to every other unit capacitances among one alignment of capacitances. It is possible to control the dispersion of a pattern on forming a unit capacitance by placing unused unit capacitances around the arrangement.

As mentioned above, an input signal is sampled and held as an analog signal along the time sequence and classified into "1" and "−1". The classified signals are added in parallel by capacitive couplings in a matched filter circuit. Therefore, it is possible to realize a small size and low electric power consumption of a matched filter circuit according to the present invention.

What is claimed is:

1. A matched filter circuit comprising:

I) a plurality of sampling and holding circuits, each sampling and holding circuit comprising:
      i) a switch being connected to an input voltage,
      ii) a first capacitance being connected to an output portion of said switch,
      iii) a first inverted amplifying portion including an odd number of stages of MOS inverters and being connected to said first capacitance,
      iv) a first feedback capacitance connecting an output portion of said first inverted amplifying portion to its input portion,
      v) a first multiplexer receiving an output of said first inverted amplifying portion and a reference voltage and alternatively outputting said received signals, and
      vi) a second multiplexer receiving said output of said first inverted amplifying portion and said reference voltage and alternatively outputting said received signals opposite to said output from said first multiplexer;

II) a plurality of first addition portions, each first addition portion comprising:
      i) a plurality of second capacitances, each second capacitance being connected to an output portion of said first multiplexer of a corresponding sampling and holding circuit, and output portions of said second capacitances being connected with one another to form a common output,
      ii) a second inverted amplifying portion including odd number of stages of MOS inverters and being connected to said common output of said second capacitances, and
      iii) a second feedback capacitance connecting an output portion of said second inverted amplifying portion to its input portion;

III) a plurality of second addition portions, each second addition portion comprising:
      i) a plurality of third capacitances each third capacitance being connected to an output portion of siad second multiplexer of a corresponding sampling and holding circuit, and output portions of said capacitances being connected with one another to form a common output,
      ii) a third inverted amplifying portion having odd number of stages of MOS inverters and being connected to said common output of said third capacitances, and
      iii) a third feedback capacitance connecting an output portion of said third inverted amplifying portion to its input portion; and IV) a control circuit for closing said switch of one of said sampling and holding circuits, opening said switches of other said sampling and holding circuits, and switching said first and second multiplexer of each said sampling and holding circuit by a predetermined combination.

2. A matched filter circuit as claimed in claim 1, wherein said sampling and holding circuits are divided into a plurality of groups, each group including at least one each of said first and second addition portions and further comprising:

a) a fourth addition portion being connected to output portions of said first addition portions of all of said groups, said fourth addition portion comprising a plurality of fourth capacitances, each fourth capacitance being connected with one of said output portion of said first addition portion, a fourth inverted amplifying portion having odd stages of MOS inverters commonly receiving said outputs of said fourth capacitances and a fourth feedback capacitance connecting an output portion of said fourth inverted amplifying portion to its input portion, and b) a fifth addition portion being connected to output portions of each of second addition portion of all of said groups, said fifth addition portion comprising a plurality of fifth capacitances, each fifth capacitance being connected with one of said output portion of said second addition portion, a fifth inverted amplifying portion having odd stages of MOS inverters commonly receiving said outputs of said fifth capacitances and a fifth feedback capacitance connecting an output portion of said fifth inverted amplifying portion to its input portion.

3. A matched filter circuit as claimed in claim 1, wherein said reference voltage is generated by a reference voltage generating circuit comprising a sixth inverted amplifying portion, and a sixth feedback connecting an output portion of said sixth inverted amplifying portion to its input portion.

4. A matched filter circuit as claimed in claims 1, 2 or 3, wherein each inverted amplifying portion further comprises a grounded capacitance between said output portion of each inverted amplifying portion and the ground, and a pair of balancing resistances being connected at an output portion of said MOS inverters other than an output portion of a last stage MOS inverter, a supply voltage and the ground being connected to one of said balancing resistance, respectively.

5. A matched filter circuit claimed in claim 3, wherein a threshold voltage of each of said MOS inverters of said sixth inverted amplifying portion is adjusted to set said reference voltage to the ½ of the supply voltage.

6. A matched filter circuit as claimed in claim 1, wherein said control circuit controls said sampling and holding circuits so as to hold said input voltage by said sampling and holding circuits circulatingly in a predetermined order.

* * * * *

UNITED STATES PATENT AND TRADEMARK OFFICE
CERTIFICATE OF CORRECTION

PATENT NO. : 5,841,315

DATED : November 24, 1998

INVENTOR(S) : Guoliang Shou, et al

It is certified that error appears in the above-identified patent and that said Letters Patent is hereby corrected as shown below:

On the Title Page, Item [*] Notice should be added: The term of this patent shall not extend beyond the expiration date of Pat. No. 5, 872,466.

Signed and Sealed this

Thirteenth Day of July, 1999

Attest:

Q. TODD DICKINSON

Attesting Officer

Acting Commissioner of Patents and Trademarks